United States Patent [19]
Liebman et al.

[11] Patent Number: 5,167,361
[45] Date of Patent: Dec. 1, 1992

[54] METHOD AND APPARATUS FOR TWO SIDED SOLDER CLADDED SURFACE MOUNTED PRINTED CIRCUIT BOARDS

[75] Inventors: Henry F. Liebman, Tamarac; Anthony B. Suppelsa, Coral Springs; Francisco de Costa Alves, Boca Raton, all of Fla.

[73] Assignee: Motorola, Inc., Schaumburg, Ill.

[21] Appl. No.: 700,981

[22] Filed: May 16, 1991

[51] Int. Cl.$^5$ ............................................. B23K 31/02
[52] U.S. Cl. ............................... 228/180.2; 228/254; 228/173.3
[58] Field of Search .................. 228/173.3, 248, 180.2, 228/254

[56] References Cited

U.S. PATENT DOCUMENTS 4,752,027 6/1988 Gschwend ..................... 228/180.2
4,889,275 12/1989 Mullen et al. ................. 228/180.2

FOREIGN PATENT DOCUMENTS 59-39467 3/1984 Japan ................................. 228/248

OTHER PUBLICATIONS

IBM Technical Disclosure Bulletin, vol. 32, No. 1, Jun. 1989, pp. 50-51.

Primary Examiner—Richard K. Seidel
Assistant Examiner—Jeffrey T. Knapp
Attorney, Agent, or Firm—Pablo Meles

[57] ABSTRACT

A method of forming flat solder bumps (16 and 18) on contact areas (12 and 14) of a first side and second side of a printed circuit board (12, 14 and 10) comprises the steps of applying solder paste in a predetermined pattern and a predetermined thickness on the contact areas of the first side and the second side of the printed circuit board forming joint areas. Next, the solder paste is reflowed. Then, the solder joints on the first side are flattened (17). Before surface mounted components (20 and 26) are mounted on the printed circuit board, tack media (32) is dispensed onto the joint areas. Subsequently, the printed circuit boards is reflowed. Now the second side of the printed circuit board is flattened (19). As with the first side, tack media (34) is dispensed on the solder joints on the second side before surface mounted components (40 and 46) are mounted on the second side. Finally, the printed circuit board is reflowed again.

23 Claims, 4 Drawing Sheets

METHOD AND APPARATUS FOR TWO SIDED SOLDER CLADDED SURFACE MOUNTED PRINTED CIRCUIT BOARDS

TECHNICAL FIELD

This invention relates generally to soldering techniques for printed circuit boards and, more particularly to a method and apparatus for providing flat solder joints on both sides of a printed circuit board.

BACKGROUND

The increased use of flat leadless surface mount components in electronic circuitry presents new challenges in the automated methods of soldering. Higher packing densities of surface mount components necessitates reduced solder joint size, volume, and, likewise, reduced spacing between solder joints. Since conventional through-hole insertion of components may be inappropriate for surface mounted components where both sides of the printed circuit board are used, other methods allowing for the accurate placement of components are required.

The geometry of conventional solder bumps presents problems in the placement and alignment of surface mounted components. U.S. Pat. No. 4,752,027 by Gschwend (and hereby incorporated by reference) discusses a method of flattening the peaks of solder bumps (by using rollers) for better alignment of surface mounted components on one side. Although the Gschwend method may improve the alignment of components in an automated system, other problems still remain. The warping of printed circuit boards due to thermal expansion and contraction, and solder splatter remains and may cause the misalignment of surface mounted components. Moreso, bottomside redoming of the solder joints remains a problem after reflow of the topside of the printed circuit board. In other words, bottomside flat joints sag into spherical joints again due to the reflow of the topside. Thus the problem of surface mount component misalignment and misplacement still remains.

SUMMARY OF THE INVENTION

A method of forming flat solder bumps on contact areas of a first side and second side of a printed circuit board comprises the steps of applying solder paste in a predetermined pattern and a predetermined thickness on the contact areas of the first side and the second side of the printed circuit board forming joint areas. Next, the solder paste is reflowed or fused. Then, the solder joints on the first side are flattened if necessary. Tack media is then dispensed onto the joint areas on the first side and surface mounted components are mounted on the printed circuit board. Subsequently, the printed circuit board is reflowed. Now the second side of the printed circuit board is flattened. As with the first side, tack media is dispensed on the solder joints on the second side before surface mounted components are mounted on the second side. Finally, the printed circuit board is reflowed again.

DETAILED DESCRIPTION OF THE PREFERRED EMBODIMENT

Figure 1A:
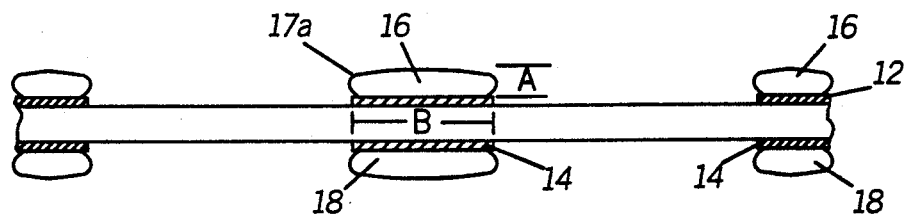
FIG. 1A is a cross section of a printed circuit board (pcb) with printed and fused solder applied to both top and bottom sides.
Figure 1B:
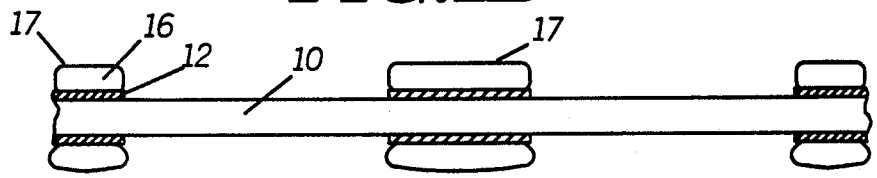
FIG. 1B is the pcb of FIG. 1A having flattened solder bumps on one side in accordance with the present invention.

Referring to FIG. 1A, there is shown a substrate 10 with printed circuitry 12 on the top surface and printed circuitry 14 on the bottom surface forming a printed circuit board (PCB). Solder layers 16 and 18 are applied (preferably discretely dispensed or screened on) to the printed circuitry 12 and 14 respectively. The thickness of the solder layers used varies according to the method of flattening used. Preferably, a thickness of 8 to 14 mils of solder paste is used for the method utilizing a circular blade as shown in FIG. 3B and preferably a thickness of greater than 5 mils of solder paste is utilized with the heated flattening platter method discussed in conjunction with FIG. 2. Ideally, the predetermined thickness of solder paste could be used within the range of 3 to 20 mils thick. The solder paste on the PCB is then reflowed. Referring to FIG. 1B, once the solder is applied and reflowed, the top surface solder joints are flattened to provide a substantially flat surface 17, preferably using a heated press or vice for flattening (as in FIG. 2) or a fly-cutter, a circular cutting blade or a Q-cutter. The flattening of solder bumps preferably leaves the solder bumps to within 2 to 4 mils from the surface of the PCB.

In the alternative, referring again to FIG. 1, the need to flatten the top surface solder joints can be eliminated if the curvature of the top surface solder joints are slight enough and the top surface 17a is substantially flat enough to prevent the surface mounted components from misaligning and slipping during picking and placing operations. If the solder joint 16 has a solder joint height (after reflow) A and solder pad length B, wherein the ratio of A to B is approximately less than ⅓, then the need to flatten the top or first side solder joint is typically not necessary. If the ratio of A to B is approximately greater than ⅓, then the top surface solder joint should be flattened, preferably using one of the disclosed methods disclosed in the present invention.

Of course, other methods of flattening including a vertical press or a roller can be used to flatten the solder joints 16. If a vertical press is used, both top and bottom solder joints (16 and 18) would be flattened, but the bottom solder joints would sag or redome once it is reflowed. Once the solder joint on the top surface is flattened (or if it is substantially flat already due to a low A to B ratio), the PCB is more receptive to surface mounted components, allowing for accurate placement and less likelihood of misalignment.

Figure 1C:
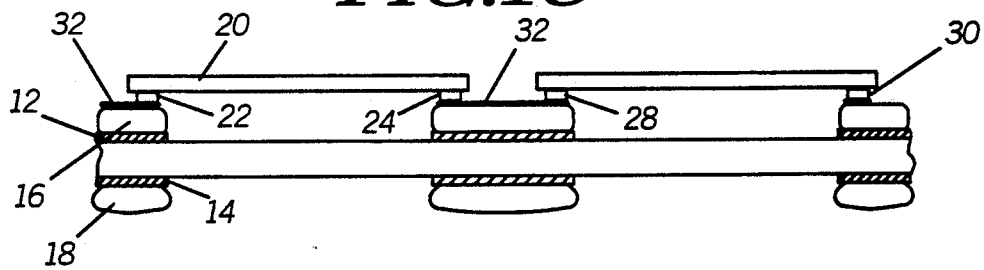
FIG. 1C is the pcb of FIG. 1B, further including a surface mounted component attached in accordance with the present invention.
Figure 1D:
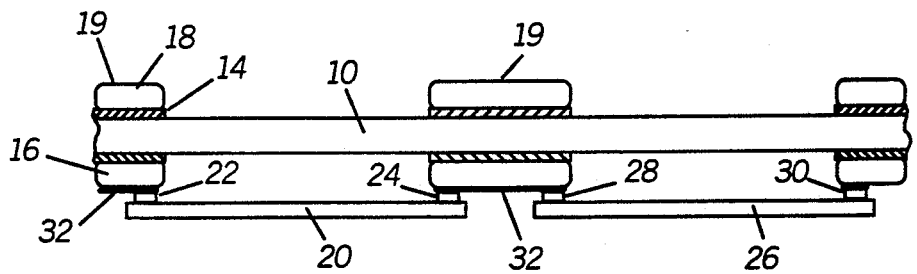
FIG. 1D is an vertically inverted view of FIG. 1C, and further including flattened solder bumps on the other side in accordance with the present invention.
Figure 1E:
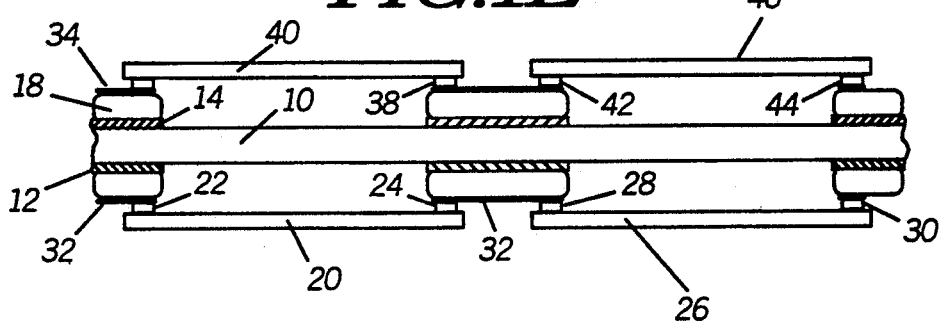
FIG. 1E is a cross section of a solder cladded surface mounted module in accordance with the present invention.

Referring to FIG. 1C, a tack media 32 is applied on the flattened solder joint 16 to provide sufficient stickiness to the solder joint during reflow. As an illustration, surface mounted component 20 having contact points 22 and 24 and surface mounted component 26 having contact points 28 and 30 are placed and preferably coupled to the solder joints 16 as shown. The assembly shown in FIG. 1C is then put through reflow. At this point, the solder 18 on the bottom side would likely redome, making the further mounting of surface mounted components on the bottom side susceptible to misalignment. FIG. 1D shows the assembly of FIG. 1C vertically inverted. The solder joints 18 are now flattened, preferably in the same manner solder joints 16 were flattened, via a rotating cutter, to provide a substantially flattened surface 19. Once again, tack media 34 is applied to the flattened solder joint 18 before further surface mounted components are placed on the solder joint. As before, surface mounted components 40 and 46 are mounted on the solder joints 18 via contact points 36, 38, 42, and 44 as shown. The assembly in FIG. 1E is then put through reflow oven. Optionally, the assembly in FIG. 1E is then washed.

Figure 2:
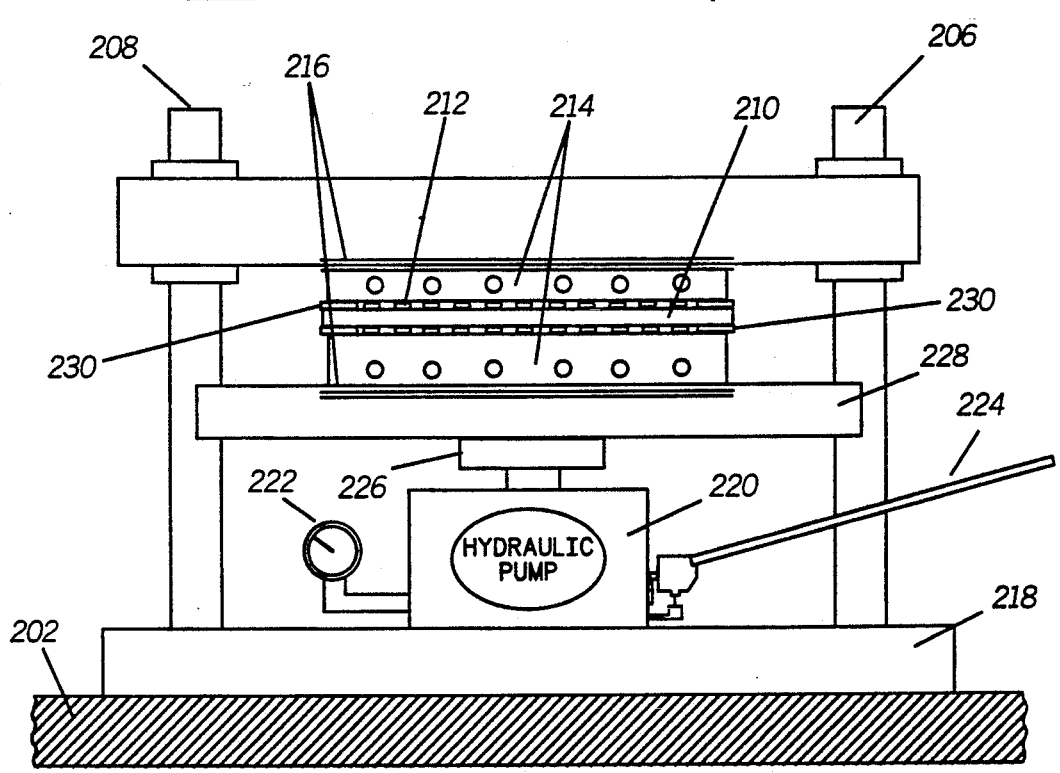
FIG. 2 is a front planar view of a solder flattening tool in accordance with the present invention.

Referring to FIG. 2, there is shown a solder flattening tool 200 on a level surface such as table 202. The flattening tool comprises a base plate 218 and a top plate 204 coupled together by column members 206 and 208. The flattening tool 200 is essentially a vertical press preferably having a hydraulic pump 22 for applying pressure via member 226 to a pallet 228. The pressure is typically adjusted using a hank crank 224 while a pressure gauge 222 provides the pressure reading. The flattening tool 200 further comprises heat controlled solder flattening plates 214 (preferably kept at a temperature between 170° C. and 175° C.) that lie between the top plate 204 and the pallet 228. Since the plates 214 are maintained at high temperatures, high temperature insulating pads 216 are preferably provided between the heated plates 214 and the pallet 228 and/or the top plate 204. Operationally, a printed circuit board 210 having reflowed solder bumps 212 thereon would be compressed between the top and bottom heat controlled solder flattening plates 214. The solder bumps should be heated to a temperature that provides a plastic state. Mechanical stops 230 such as shims are preferably used to prevent the flattening plates 214 from compressing the solder bumps 212 beyond the point where solder joints would short each other. The use of shims could also be used to vary the required thickness of solder paste necessary for use in the present invention. Once the PCB is compressed, the pressure is released, and a new pcb with solder bumps could be ready for flattening. Other features not shown could include bottom pins to support the PCB bottom side. The press could also include a vacuum to pull the PCB down against the plate. The vacuum would compensate for any warpage existing in the PCB. If desirable, the press could also include a matrix of pin holes and pins so as to facilitate the robotic placement of a PCB with holes onto the pallet. (See FIG. 3).

Figure 3A:
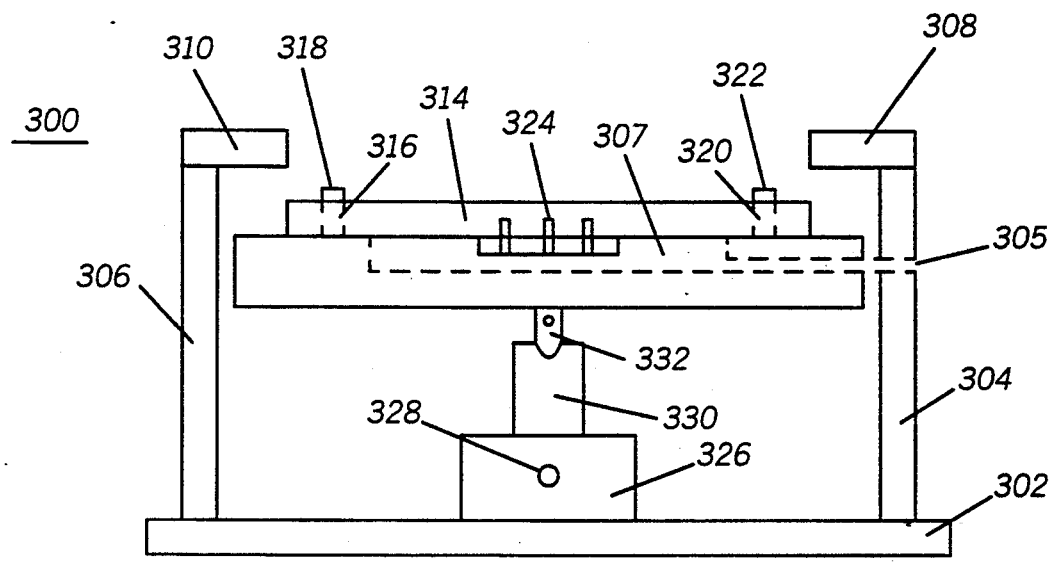
FIG. 3A is a front planar view of another solder flattening tool in a first position in accordance with the present invention.
Figure 3B:
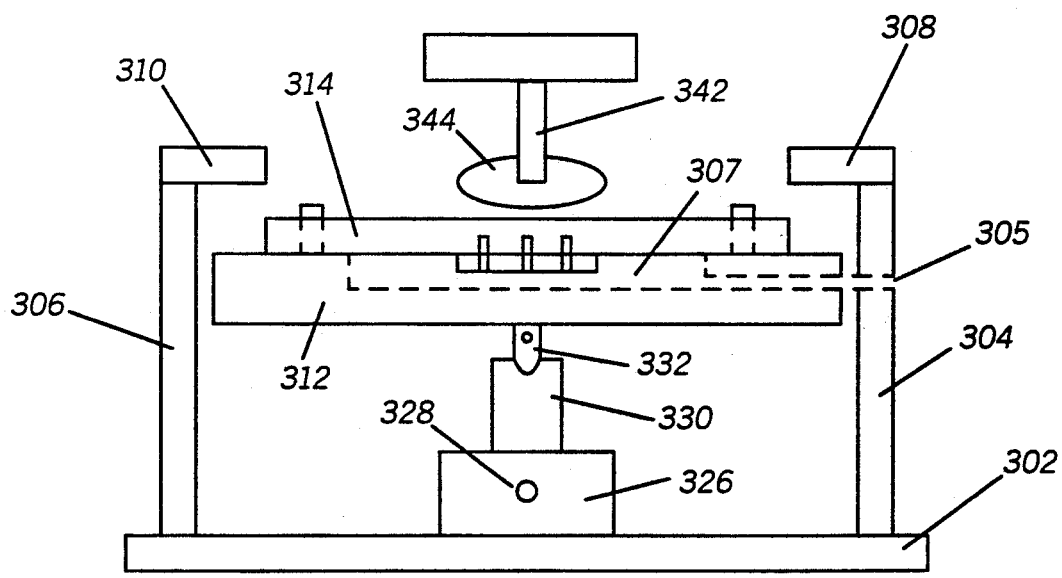
FIG. 3B is the front planar view of the solder flattening tool of FIG. 3A in a second position along with a rotary cutter.
Figure 4:
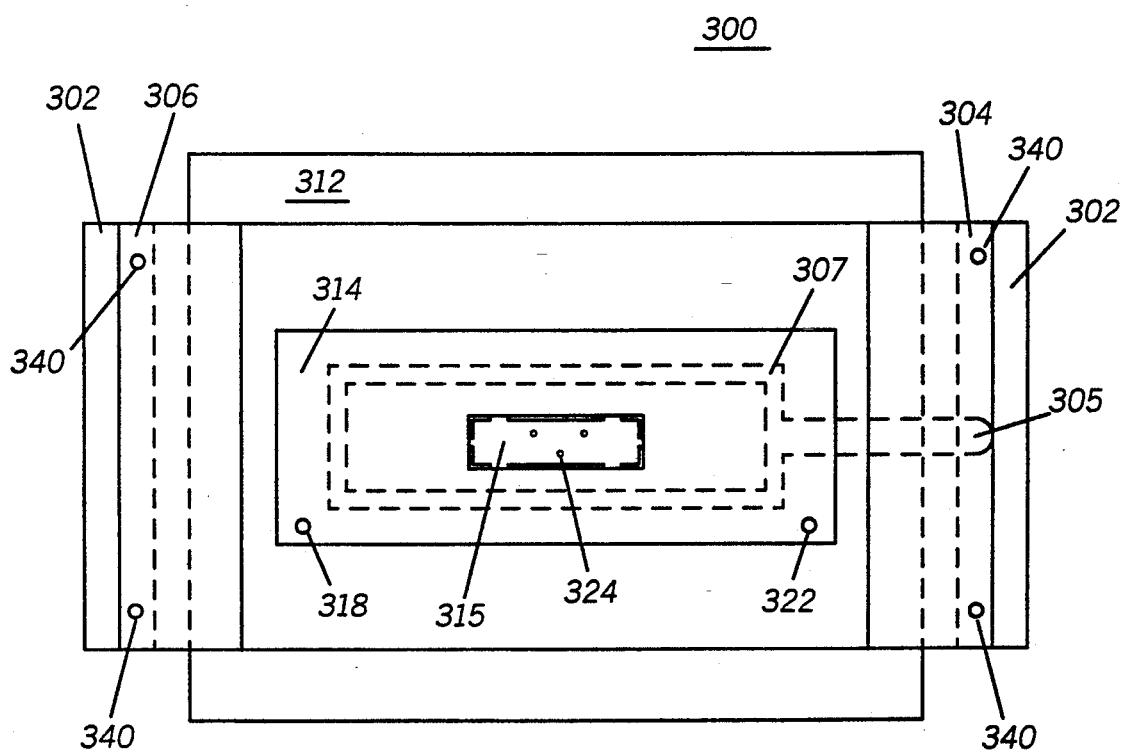
FIG. 4 is top planar view of the solder flattening tool of FIGS. 3A and 3B.

Referring to FIG. 3A, there is shown a solder cladding apparatus 300 in accordance with the present invention. The apparatus 300 comprises a base plate 302 having opposing vertical members 306 and 304. Horizontal members 308 and 310 are attached (preferably with bolts 340—See FIG. 4) to the vertical members 304 and 306 respectively. Preferably, all parts of the apparatus 300 (except for the printed circuit board 314) are made of a metal that can be smoothly finished such as aluminum or stainless steel. A hydraulic pump 326 (unpressurized in FIG. 3A) having an air intake hole 328 is centrally disposed on the base plate 302. As air is pumped through the air intake hole 328, the vertically protruding member 330 forces a pallet 312 upwards and, consequently, a printed circuit board 314 (mounted on the pallet 312) is pressed against the horizontal members 308 and 310 as shown in FIG. 3B. In this manner, the printed circuit board 314 having through holes 316 and 320 is accurately placed on the pallet by means of locater pins 318 and 322. A gimbal 322 attached to the bottom of the pallet 312 allows the pallet to incline slightly in any direction. In this manner, the printed circuit board can be placed easily onto the pallet 312. Preferably, greater accuracy can be achieved by having an array of holes in the pallet 312 (not shown) wherein selectively placed pins 324 would assist in the alignment of the printed circuit board 314 on the pallet 312. Additionally, an aperture 305 within the vertical member 304 is provided to allow a vacuum to provide suction through a groove area 307 within the pallet 312. Referring to FIGS. 3A, 3B and 4, the suction through the groove 307 sucks down the printed circuit board 314 against the pallet 312 so as to prevent warpage or bending of the PCB while the solder domed pads are being cut flat. The solder bumps (not shown) within the area of the PCB 314 and preferably within the area 315 (shown in FIG. 4) are flattened using a circular blade, saw, or Q-cutter 344. The desired height of the flatten solder bumps are determined by using the bottom portion of the vertical members 308 and 310 as a reference point. This allows for accurate cutting of the domed solder areas to within $< \pm 1$ mil of the desired thickness.

What is claimed is:

1. A method of forming flat solder bumps on contact areas of a first side and a second side of a printed circuit board, comprising the steps of:
    (a) applying solder paste in a predetermined pattern and a predetermined thickness on said contact areas of said first side and said second side of said printed circuit board forming joint areas;
    (b) reflowing said solder paste a first time on said printed circuit board;
    (c) dispensing tack media to the joint areas on said first side;
    (d) surface mounting components on said first side of said printed circuit board;
    (e) reflowing said solder paste a second time on the printed circuit board;
    (f) after reflowing said solder paste said second time, flattening said solder paste on said second side of said printed circuit board;
    (g) dispensing tack media to the joint areas on said second side;
    (h) surface mounting components on said second side of said printed circuit board;
    (i) reflowing said solder paste on the printed circuit board.

2. The method as in claim 1 wherein the predetermined thickness of solder is within the range of 3 to 20 mils.

3. The method of claim 1 wherein the flattening of solder bumps is performed by rollers.

4. The method of claim 1 wherein the flattening of solder bumps is performed by a Q-cutter.

5. The method of claim 1 wherein the flattening of solder bumps is performed by a flattening device which further includes a means for retaining the printed circuit board substantially flat against a pallet.

6. The method flat of claim 5, wherein said means comprises a groove having suction.

7. The method of claim 1, wherein said flattening of said second side of said board is within the range of 2 to 4 mils of the surface of said printed circuit board.

8. A method of forming flat solder bumps on contact areas of a first side and a second side of a printed circuit board, comprising the steps of:
   (a) applying solder paste in a predetermined pattern and a predetermined thickness on said contact areas of said first side and said second side of said printed circuit board forming joint areas;
   (b) reflowing said solder paste a first time on said printed circuit board;
   (c) flattening said first side of the printed circuit board;
   (d) dispensing tack media to the joint areas on said first side;
   (e) surface mounting components on said first side of said printed circuit board;
   (f) reflowing said solder paste a second time on the printed circuit board;
   (g) after reflowing said solder paste said second time, flattening said solder paste on said second side of said printed circuit board;
   (h) dispensing tack media to the joint areas on said second side;
   (i) surface mounting components on said second side of said printed circuit board;
   (j) reflowing said solder paste on the printed circuit board.

9. The method as in claim 8 wherein the predetermined thickness solder is within the range of 3 to 20 mils.

10. The method of claim 8 wherein the flattening of solder bumps is performed by rollers.

11. The method of claim 8 wherein the flattening of solder bumps is performed by a Q-cutter.

12. The method of claim 8 wherein the flattening of solder bumps is performed by a flattening device which further includes a means for retaining the printed circuit board substantially flat against a pallet.

13. The method flat of claim 12, wherein said means comprises a groove having suction.

14. The method of claim 8, wherein said flattening of said first and said second side of said board is within the range of 2 to 4 mils of the surface of said printed circuit board.

15. A method of forming flat solder bumps on contact areas of a first side and a second side of a printed circuit board, comprising the steps of:
   (a) screening on solder paste in a predetermined pattern and a predetermined thickness on said contact areas of said first side of said printed circuit board forming joint areas;
   (b) screening on solder paste in a predetermined pattern and a predetermined thickness on said contact areas of said second side of said printed circuit board forming joint areas;
   (c) reflowing said solder paste a first time on said printed circuit board;
   (d) flattening the solder bumps of at least said first side of the printed circuit board;
   (e) dispensing tack media to the joint areas on said first side;
   (f) surface mount components on said first side of said printed circuit board;
   (g) reflowing said solder paste a second time on the printed circuit board;
   (h) after reflowing said solder paste said second time, flattening said solder paste on said second side of said printed circuit board;
   (i) dispensing tack media to the joint areas on said second side;
   (j) surface mounting components on said second side of said printed circuit board;
   (k) reflowing said solder paste on the printed circuit board.

16. The method as in claim 15 wherein the predetermined thickness of solder is within the range of 3 to 20 mils.

17. The method of claim 15 wherein the flattening of solder bumps is performed by rollers.

18. The method of claim 15 wherein the flattening of solder bumps is performed by a Q-cutter.

19. The method of claim 15 wherein the flattening of solder is performed by a heated vice.

20. The method of claim 15 wherein the flattening of solder bumps is performed by a flattening device having at least two members oriented parallel to said first and said second side of said printed circuit board, which further includes a means for retaining the printed circuit board substantially flat against a pallet.

21. The method of claim 20, wherein said means comprises a groove having suction.

22. A method of forming flat solder bumps on contact areas of a first side and a second side of a printed circuit board, comprising the steps of:
   (a) screening on solder paste in a predetermined pattern and a predetermined thickness on said contact areas of said first side of said printed circuit board forming joint areas;
   (b) reflowing said solder paste a first time on said printed circuit board;
   (c) screening on solder paste in a predetermined pattern and a predetermined thickness on said contact areas of said second side of said printed circuit board forming joint areas;
   (d) reflowing said solder paste a second time on said printed circuit board;
   (e) flattening at least said first side of the printed circuit board;
   (f) dispensing tack media to the joint areas on said first side;
   (g) surface mounting components on said first side of said printed circuit board;
   (h) reflowing said solder paste a third time on the printed circuit board;
   (i) after reflowing said solder paste said third time, flattening said solder paste on said second side of said printed circuit board;
   (i) dispensing tack media to the joint areas on said second side;
   (j) surface mounting components on said second side of said printed circuit board;
   (k) reflowing said solder paste on the printed circuit board.

23. The method of claim 22, wherein said method further comprises the following step of: (I) cleaning said printed circuit board.

* * * * *